United States Patent
Tamura

[19]

[11] Patent Number: 6,066,947
[45] Date of Patent: May 23, 2000

[54] MAGNETIC DETECTION DEVICE HAVING A PLURALITY OF FIRST AND SECOND MAGNETORESISTIVE ELEMENTS

[75] Inventor: Shinichi Tamura, Susono, Japan

[73] Assignee: Yazaki Corporation, Tokyo, Japan

[21] Appl. No.: 09/004,853

[22] Filed: Jan. 9, 1998

[30] Foreign Application Priority Data

Jan. 10, 1997 [JP] Japan ..................................... 9-003181

[51] Int. Cl.[7] .............................. G01B 7/14; H01L 43/08; G01R 33/02
[52] U.S. Cl. .................. 324/207.21; 324/252; 338/32 R
[58] Field of Search ........................ 324/207.21, 207.25, 324/252, 174; 338/32 R; 360/113

[56] References Cited

U.S. PATENT DOCUMENTS

| 5,432,494 | 7/1995 | Inoue et al. | 324/252 |
| 5,477,143 | 12/1995 | Wu | 324/207.2 |

FOREIGN PATENT DOCUMENTS

3-195970  8/1991  Japan .

*Primary Examiner*—Walter E. Snow
*Attorney, Agent, or Firm*—Oblon, Spivak, McClelland, Maier & Neustadt, P.C.

[57] ABSTRACT

A compact magnetic detection device with a high sensitivity. The device includes a single bias magnet producing a magnetic field to a gear having a magnetic substance, and a magnetoresistive effect element. The element is arranged so as to oppose the bias magnet and adjoin a pole face of the magnet on the gear's side. Further, the element is arranged in a plane substantially perpendicular to a moving direction of the gear, for producing resistance change caused by changes of magnetic field in response to the movement of the gear. Thus, the bias magnetic field existing in the moving direction of the gear is modulated to the direction facing the gear. Since a magnitude of modulation against the bias magnetic field amounts to a maximum in the vicinity of the pole face of the bias magnet on the gear's side, it is possible to realize the high sensitivity and furthermore, the magnetic detection device can be miniaturized by use of the single magnet.

10 Claims, 12 Drawing Sheets

MOVING DIRECTION

MAGNETIC DETECTION DEVICE HAVING A PLURALITY OF FIRST AND SECOND MAGNETORESISTIVE ELEMENTS

BACKGROUND OF THE INVENTION

1. Field of the Invention

The present invention relates to a supersensitive magnetic detection device for detecting displacements and rotations etc. of an object to be detected, by making use of a change in resistance (resistance change) in a magnetoresistive effect element.

2. Discussion of the Background

Hitherto, a magnetic sensor has been widely utilized because of its compactness. Being provided with a bias magnet, the magnetic sensor operates to detect the displacements and rotations etc. of an object composed of magnetic material by making use of a resistance change in a magnetoresistive effect element.

Figure 1:
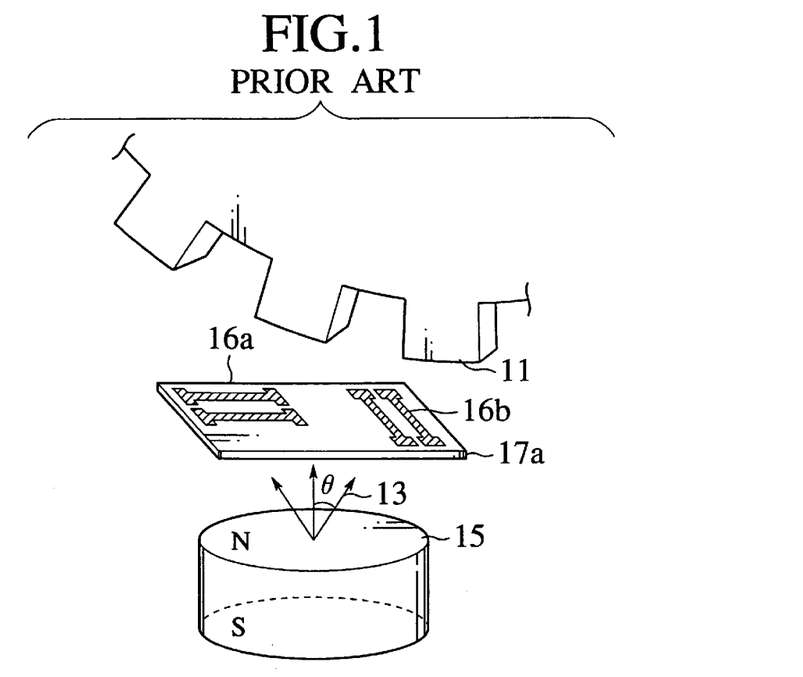
FIG. 1 is a perspective view showing a prior art magnetic detection device as one example.

For example, Japanese Unexamined Patent Publication (Kokai) No. 3-195970 discloses a prior art magnetic sensor of the above kind. FIG. 1 shows a principle for detection that the magnetic sensor disclosed in the publication No. 3-195970 adopts. The magnetic sensor of FIG. 1 is provided with a bias magnet 15 which produces a bias magnetic field 13 toward a gear 15 as an object to be detected, which is composed of magnetic material.

An insulating substrate 17a is disposed in a plane perpendicular to a direction of the bias magnetic field 13, and is provided with magnetoresistive effect elements 16a, 16b. Magnetic lines of force in the bias magnetic field generated from the bias magnet 15 are periodically modulated by peaks and troughs of the gear 11 and turned into a sinusoidal wave pattern, corresponding to relative positions of teeth of the gear 11.

A deflection angle θ of the bias magnetic field 13 changes with the movement of the gear 11. In the arrangement, the movement of the gear 11 is detected by detecting a change of magnetic field intensity in the direction of the deflection angle, which is caused by a change of the magnetic field angle and produced in a plane of the element 16b, as a resistance change in the element 16b.

Figure 2:
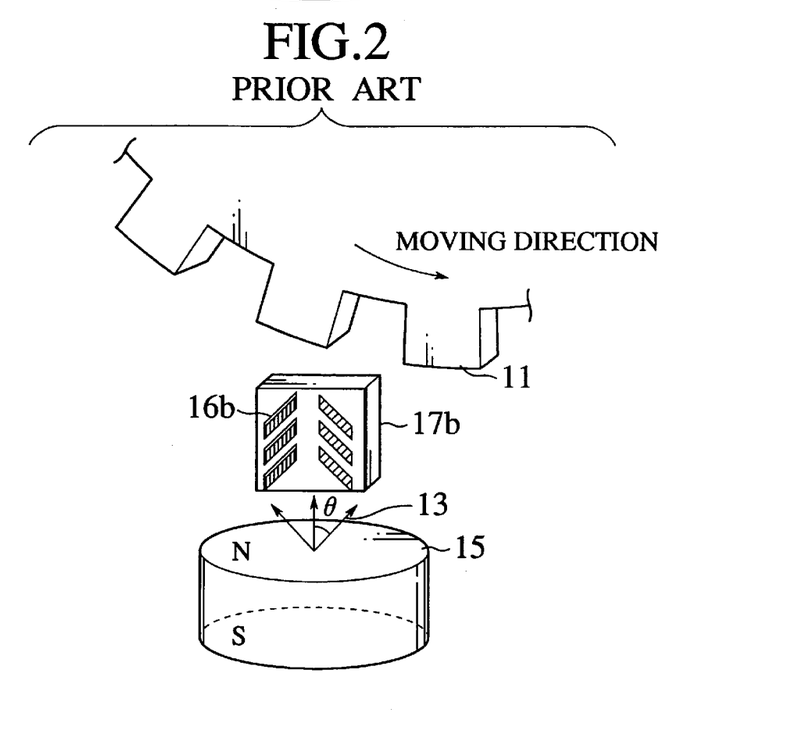
FIG. 2 is a perspective view showing the prior art magnetic detection device as another example.

FIG. 2 shows the second form of the magnetic sensor disclosed in the publication No. 3-195970. In FIG. 2, the magnetoresistive effect element 16b on an insulating substrate 17b is arranged in a plane containing a direction of the bias magnetic field 13 and a moving direction of the gear 11.

According to this form, by harnessing changes of an angle made by a magnetic direction due to the magnetic deflection and a current direction in the magnetoresistive effect element 16b, the magnetoresistive of the element 16b changes in response to state variations of the bias magnetic field 13 caused by the movement of the gear 11.

Thus, in either case of the above-mentioned first and second forms of the magnetic sensor, the direction of the bias magnetic field 13 is a direction directing the gear 11 and it makes use of a phenomenon where the direction of the magnetic field 13 deflects to the moving direction of the gear 11 in response to the movement of the gear 11.

In the conventional magnetic sensor, however, as an air gap between the gear 11 and the magnetoresistive effect elements 16a, 16b increases, the sensitivity of the magnetic sensor is lowered since the deflection angle decreases abruptly.

In order to prevent lowering the sensitivity of the sensor, the Applicant has already filled an application titled a magnetic detection device in Japanese Patent Application No. 8-172499, which is not published yet. The unpublished magnetic detection device is shown in FIG. 3.

Figure 3:
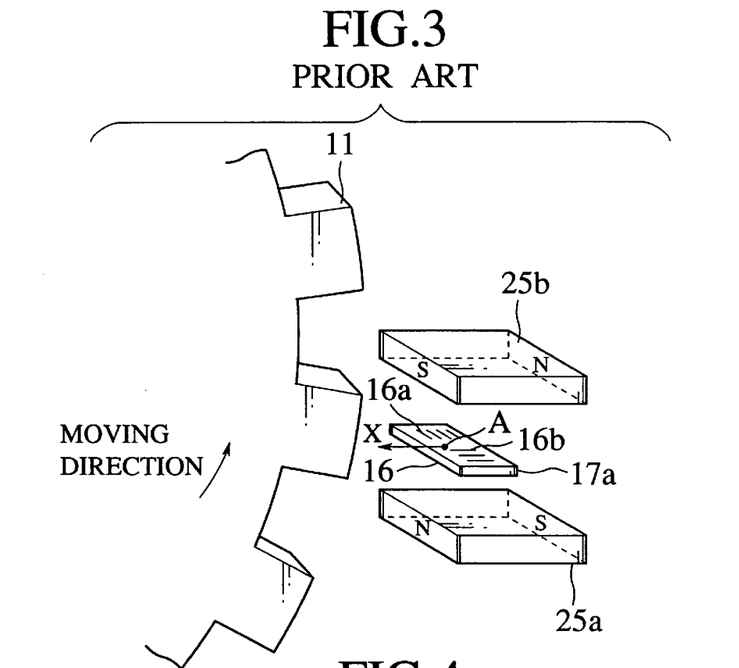
FIG. 3 is a perspective view showing the prior art magnetic detection device as the other example.

In FIG. 3, both a first magnet 25a and a second magnet 25b produce bias magnetic fields against the gear 11. The second magnet 25b is arranged to oppose the first magnet 25a in a manner that each pole of the first magnet 25a faces a different kind of pole of the second magnet 25b. Further, the first and second magnets 25a, 25b are arranged along the moving direction of the gear 11.

The magnetoresistive effect element 16 is disposed in a magnetic field between the first magnet 25a and the second magnet 25b and arranged in a plane perpendicular to the moving direction of the gear 11, for producing the resistance change by state variations of the bias magnetic field in response to the movement of the gear 11.

Figure 4:
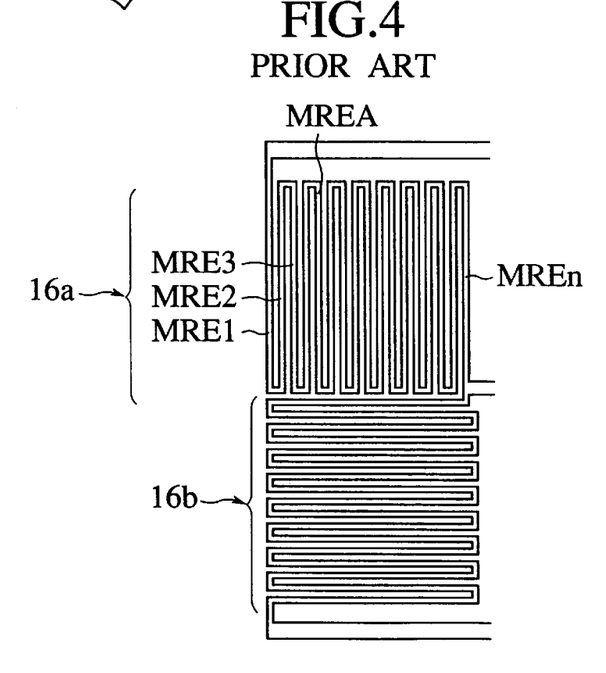
FIG. 4 is a structural diagram showing magnetoresistive effect elements of the magnetic detection device of FIG. 3.

In the magnetoresistive effect element 16, as shown in FIG. 4, the magnetoresistive effect element 16b is connected to the magnetoresistive effect element 16a in series. The element 16a is arranged in a direction perpendicular to a direction X directing the gear 11, the element 16b is arranged along the direction X.

Figure 5:
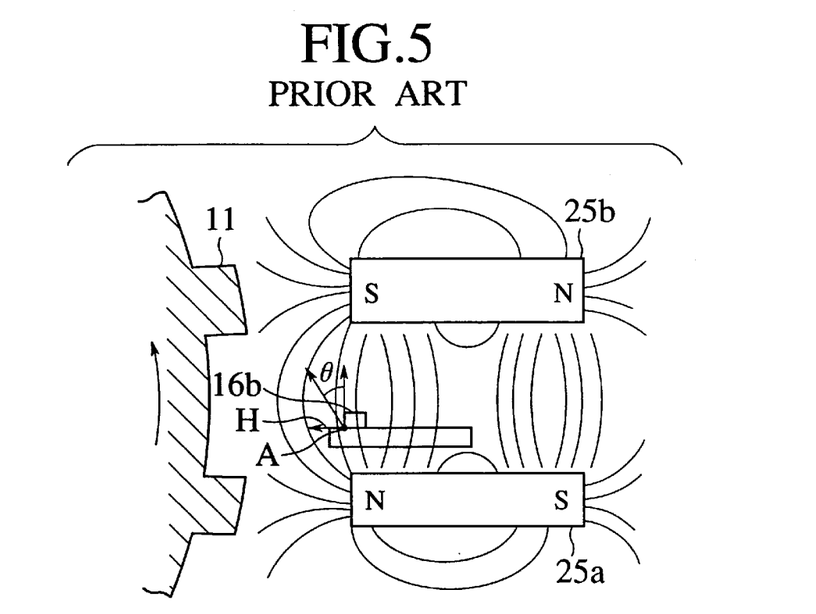
FIG. 5 is a diagram showing a deflection angle of a magnetic filed of the magnetic detection device of FIG. 3.

According to the magnetic detection device constructed above, as shown in FIG. 5, the bias magnetic field in the moving direction of the gear 11 is produced in a space defined between the first magnet 25a and the second magnet 25b. Owing to the movement of the gear 11, the bias magnetic field is deflected and modulated by the deflection angle θ to the direction X facing the gear 11.

Therefore, the magnetoresistive effect element 16a arranged in the direction perpendicular to the direction X directing the gear 11 produces the resistance change due to the state variation of the bias magnetic field in response to the movement of the gear 11. Consequently, the reduction in magnetic modulation against the air gap between the gear 11 and the magnetoresistive element 16a is decreased relatively, whereby the sensitivity against the air gap can be improved.

Note, although it is preferable to miniaturize the magnetic detection device of FIG. 3, it is necessary to thin the magnets 25a, 25b in the moving direction of the gear 11 and reduce a distance between the magnets 25a and 25b for that purpose.

However, such a reduction of thickness of the magnets 25a, 25b makes it impossible to ensure a sufficient magnetic field intensity. Alternatively, when reducing the distance between the magnets 25a and 25b, the magnetic change is decreased. Consequently, the sensitivity of the sensor is lowered remarkably.

Figure 6:
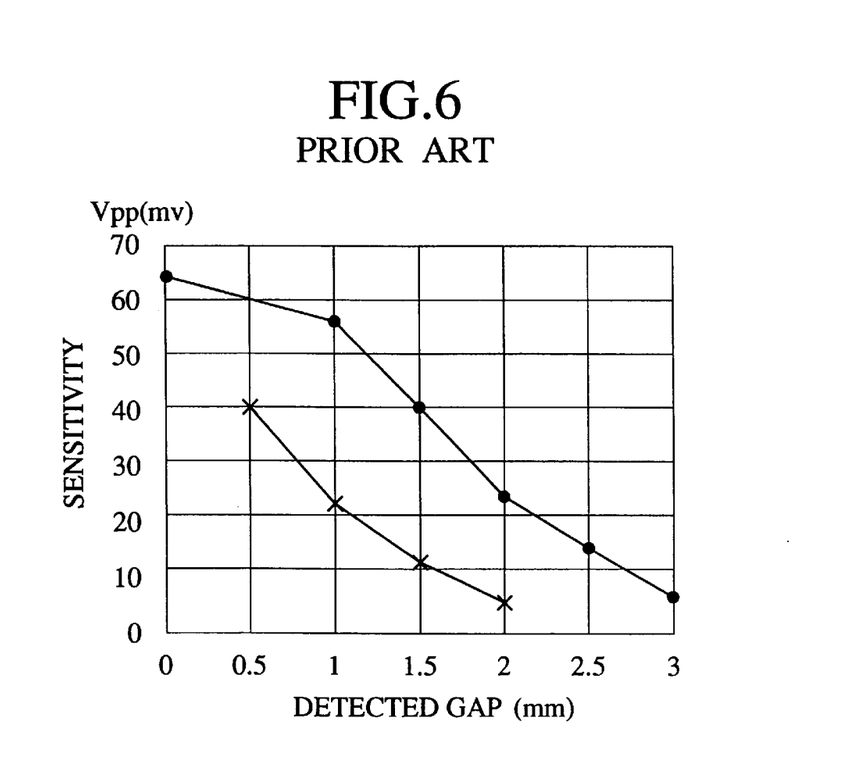
FIG. 6 is a diagram showing a relationship between sensitivity and detected gap of the magnetic detection device of FIG. 3, in which two magnets are thinned while reducing a clearance defined therebetween.

For example, in a case that the distance between two magnets each having 2 mm in thickness is 4 mm, as shown with marks ● of FIG. 6, the sensitivity varies from about 64 mV to about 7 mV with respect to a detected gap of 0 to 3 mm. Further, in case that the distance between two magnets each having 1 mm in thickness is 2 mm, as shown with marks X of FIG. 6, the sensitivity varies from about 40 mV to about 5 mV with respect to a detected gap of 0.5 to 2 mm. Consequently, it is impossible to miniaturize the magnetic detection device shown in FIGS. 4 to 6.

Figure 7:
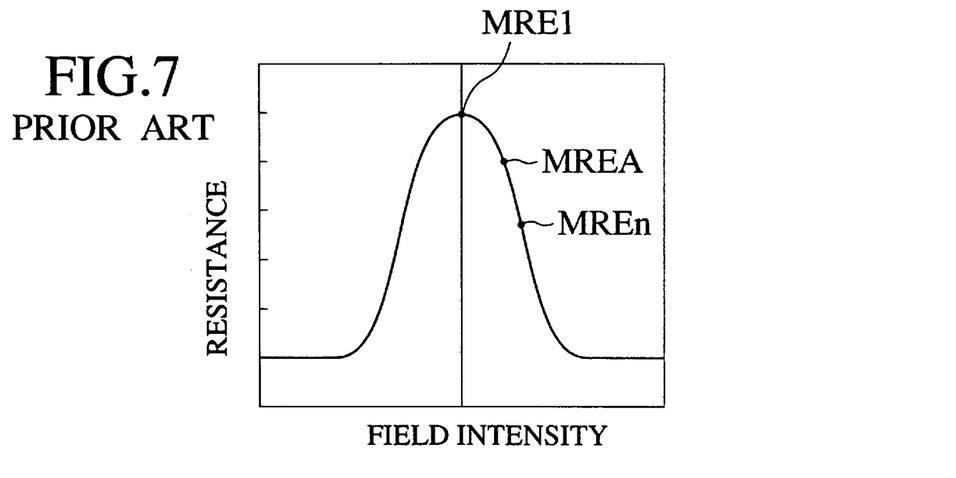
FIG. 7 is a diagram showing respective magnetic working points of elements MRE of the magnetoresistive effect element of FIG. 4.

In addition, an intensity of the magnetic field H greatly depends on a position of the direction X. Thus, under condition of arranging the magnetoresistive effect element 16 in the bias magnetic field, there is produced a difference in magnetic working point in the identical magnetoresistive effect element 16a, depending on the position. The magnetoresistive effect element 16a has a resistance changed by the magnetic filed intensity, as shown in FIG. 7.

Further, since the magnetic field varies in a predetermined range as a center of the working point due to the movement of the gear 11, the resistance changes correspondingly, too. For example, the magnetoresistive effect element (portion) MRE1 on the nearest side to the gear 11, the magnetoresistive effect element (portion) MREA at a point A, and the magnetoresistive effect element (portion) MREn on the farthest side to the gear 11 have respective working points as shown in FIG. 7.

Figure 8:
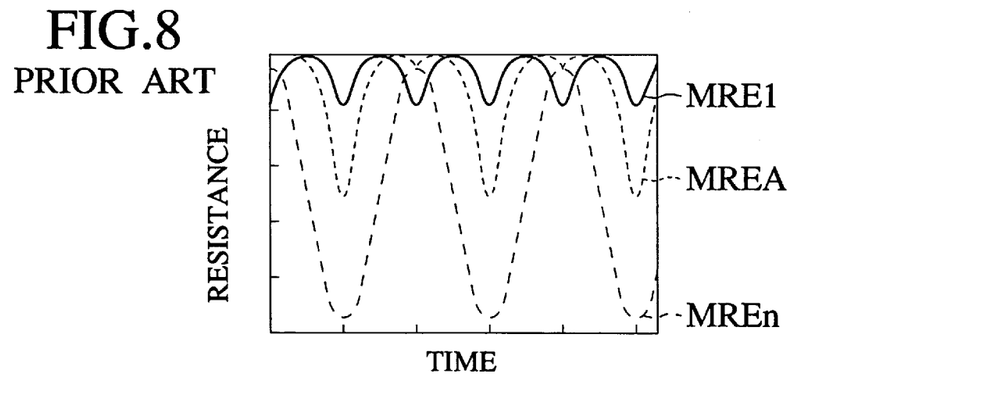
FIG. 8 is a diagram showing respective changes of resistances corresponding to the respective elements MRE of FIG. 4.
Figure 9:
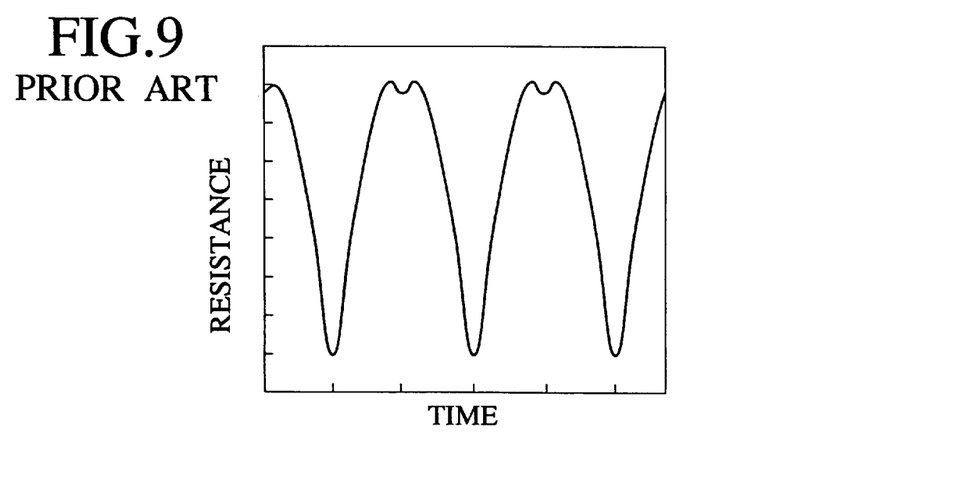
FIG. 9 is a diagram showing a change of composite resistance value of the respective resistances corresponding to the respective elements MRE of FIG. 4.

As to the changes of the resistance value with respect to changes of the magnetic field intensity of an identical range, the portion MRE1 represents the smallest value, the portion MREa an intermediate value, and the portion MREn the biggest value, as shown in FIG. 8. The resistance change of the magnetoresistive effect element 16a exhibits a waveform shown in FIG. 9, because of the composition of the portions MRE1 to MREn. Thus, since the resultant waveform has distortions as shown in the figure, there is a problem that the stable sensor output cannot be realized.

SUMMARY OF THE INVENTION

It is therefore an object of the present invention to provide a compact magnetic detection device of high sensitivity, which is capable of generating stable sensor outputs without causing any waveform distortion.

The object of the present invention described above can be accomplished by a magnetic detection device comprising:
  a bias magnet producing a magnetic field to an object having a magnetic substance; and
  magnetoresistive means arranged so as to oppose the bias magnet and adjoin a pole face thereof on a side of the object and arranged in a plane substantially perpendicular to a moving direction of the object, for producing a change of resistance by a change of the magnetic field in response to a movement of the object.

According to the invention, a bias magnetic field extending from the bias magnet to the object and another bias magnetic field in the moving direction of the object are generated. Therefore, since the magnetoresistive means is arranged so as to oppose the bias magnet and adjoin the pole face on the side of the object and arranged in the plane substantially perpendicular to the moving direction of the object, the bias magnetic field existing in the moving direction of the object is modulated to the direction facing the object by its movement after penetrating the magnetoresistive means.

Moreover, since the magnitude of modulation against the bias magnetic field amounts to a maximum in the vicinity of the pole face of the bias magnet on the side of the object, it is possible to provide the magnetororesistive means with a large change of resistance with high sensitivity owing to the arrangement of the magnetoresistive means in such a position and furthermore, the magnetic detection device can be miniaturized by use of the single magnet.

In addition to the above feature, the present invention is characterized in that the magnetoresistive means comprises a first magnetororesistive means where a plurality of first micro magnetoresistive elements are juxtaposed along a first direction facing the object and connected with each other in series, the first micro magnetoresistive elements respectively forming elongated patterns extending in a second direction generally perpendicular to the first direction, and wherein a width of the first micro magnetoresistive elements in the first direction is smaller than a dimension of the elongated patterns in the second direction by a predetermined length.

According to the above feature of the invention, since the respective micro-magnetoresistive elements form the elongated pattern arranged in the second direction generally perpendicular to the first direction directing the object, the change of resistance is produced due to the state change of the bias magnetic field corresponding to the movement of the object.

In addition, since the width of the first micromagnetoresistive elements in the first direction is smaller than the dimension of the elongated patterns in the second direction by the predetermined length, it is possible to reduce a variance of the magnetic field in the first direction because of a reduced distance between the neighboring first micro magnetororesistive elements, so that the differences among the respective resistances of the first micro magnetororesistive elements with respect to the magnetic field intensity can be decreased.

In other words, owing to a reduction of positional differences among the working points of the micromagnetoresistive elements, it is possible to reduce the differences in resistance change among the first mutual micromagnetoresistive elements, further providing sine waveforms with no waveform distortion, which are identical to each other. Accordingly, since a waveform of a composite resistance, which can be obtained by composing respective waveforms of resistances of the first micro magnetororesistive elements, exhibits a sine waveform having no waveform distortion, it is possible to accomplish the stable sensor outputs having no waveform distortion. Note, in connection with the above-mentioned feature, preferably, the first magnetoresistive elements are provided with a terminal to which an electrical power is supplied.

In addition to the above features, the magnetic detection device of the invention is characterized in that the magnetoresistive means further comprises a second magnetoresistive means connected to the first magnetororesistive means in series and arranged adjacently to a pole face of the bias magnet on the object's side, the second magnetoresistive means consisting of a plurality of second micro magnetoresistive elements which are juxtaposed along the second direction and which respectively forms patterns extending in the second direction with a dimension substantially equal to the width of the first micro magnetoresistive elements.

According to the above feature of the invention, since the second magnetoresistive means consists of the plural second micro magnetoresistive elements which are juxtaposed along the second direction to form short patterns, the resistance change in response to the change of magnetic field is considerably small in comparison with the resistance change of the first magnetoresistive means thereby to be a constant resistance value. Thus, it is possible to provide an output signal corresponding to the resistance change of the first magnetoresistive means, from an intermediate terminal between the first magnetoresistive means and the second magnetoresistive means. Note, in connection with the above-mentioned feature, preferably, the second micro magnetoresistive elements are provided with a ground terminal. More preferably, the magnetoresistive means is provided, between the first magnetororesistive elements and the second magnetororesistive elements, with an output terminal of the magnetic detection device.

In addition to the above features, the magnetic detection device of the invention is characterized in that the magnetoresistive means further comprises:
  a third magnetoresistive means connected to the second magnetororesistive means and arranged so as to extend along the second direction and adjoin the pole face of the bias magnet on the object's side, the third magnetoresistive means having a constitution identical to that of the first magnetoresistive means; and a fourth magnetoresistive means connected to the third magnetoresistive means and the first magnetororesistive means and arranged so as to extend along the second direction and adjoin the pole face of the bias magnet on the object's side, the fourth magnetoresistive means having a constitution identical to that of the second magnetoresistive means.

According to the above feature of the invention, since the first magnetoresistive means to the fourth magnetororesistive means are arranged along the second direction, it is possible to reduce a dimension of the first to fourth magnetoresistive means in the first direction relatively. Thus, since the phase difference of the intermediate electrical potential among the respective first to fourth magnetoresistive means is 180 degrees, an intermediate electrical potential exhibits a high sensor output.

These and other objects and features of the present invention will become more fully apparent from the following description and appended claims taken in conjunction with the accompanying drawing.

DESCRIPTION OF THE PREFERRED EMBODIMENT

Embodiments of the present invention will be described with reference to the drawings.

1st Embodiment

Figure 10:
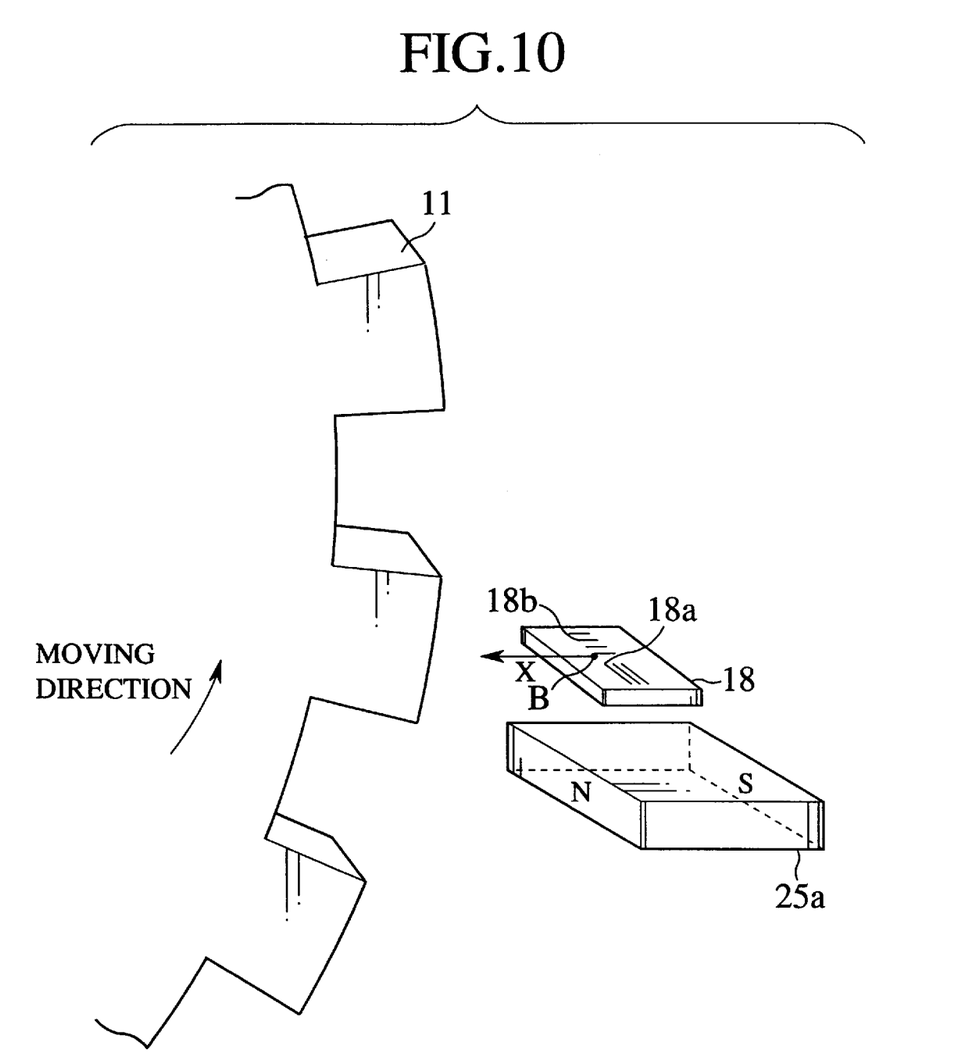
FIG. 10 is a perspective view of a magnetic detection device in accordance with a first embodiment of the present invention.

FIG. 10 shows a magnetic detection device in accordance with the first embodiment of the present invention.

The magnetic detection device of FIG. 10 is in the form of a magnetic sensor and is provided for a gear 11 as a rotating object to be detected. On the right side of the gear 1, a bias magnet 25a and a magnetororesistive effect element 18 are arranged.

The bias magnet 25a, which generates a bias magnetic field toward the gear 11 having a magnetic material, is provided with the N (North) pole on the side of the gear 11.

The magnetoresistive effect element 18 includes a magnetoresistive effect element 18a and a magnetororesistive effect element 18b. Further, the magnetororesistive effect element 18 is arranged so as to oppose the bias magnet 25a and adjoin a pole face of the bias magnet 25a on the side of the gear 11 and is disposed in a plane perpendicular to the moving direction of the gear 11. With this arrangement, the element 18 produces a change of resistance which is caused by state variations of the bias magnetic field, corresponding to the movement of the gear 11.

Figure 11:
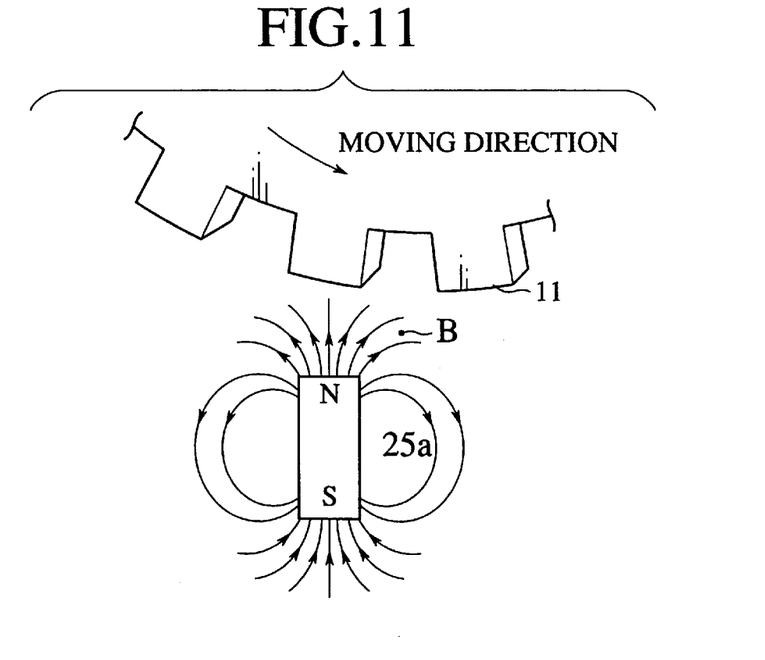
FIG. 11 is a diagram showing a magnetic line distribution of a bias magnet constituting the magnetic detection device of the first embodiment.

FIG. 11 shows a distribution of magnetic lines of the bias magnet 25a. The magnetic lines of the bias magnet 25a, in other words, the bias magnetic field comprises a magnetic field extending from the N-pole to the gear 11, a magnetic field extending from the N-pole to the moving direction of the gear 11 and a magnetic field extending from the N-pole to the S-pole.

The magnetoresistive effect element 18 is arranged in the bias magnetic field extending to the moving direction of the gear 11 and at a position B in the vicinity of the pole face of the bias magnet 25a on the side of the gear 11. Note, the bias magnetic field in the moving direction of the gear 11 is gradually decreased as being apart from the pole face of the bias magnet 25a.

Figure 12:
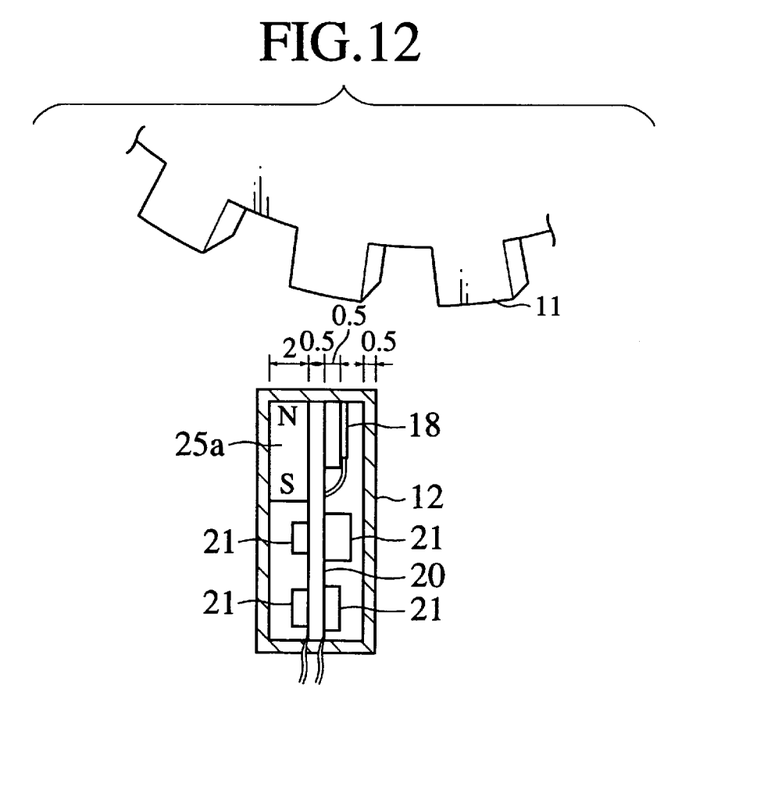
FIG. 12 is a cross sectional view of the magnetic detection device equipped with the bias magnet and a magnetoresistive effect element of the first embodiment.

FIG. 12 is a cross sectional view of the practical magnetic detection device (magnetic sensor) equipped with the magnetoresistive effect element 18 and the bias magnet 25a. In FIG. 12, accommodated in the center of an outer casing 12 of 5 mm outside horizontal size and 0.5 mm thickness is an insulating substrate 20 of e.g. 0.5 thickness on which some electronic parts 21, such as an integrated circuit (IC), resistances, condensers, etc., are mounted.

The bias magnet 25a of e.g. 2 mm thickness is arranged between a left (in the figure) wall of the outer casing 12 and the insulating substrate 20, while the magnetoresistive effect element 18 of e.g. 0.5 mm thickness is arranged between a right wall of the outer casing 12 and the insulating substrate 20.

Figure 13:
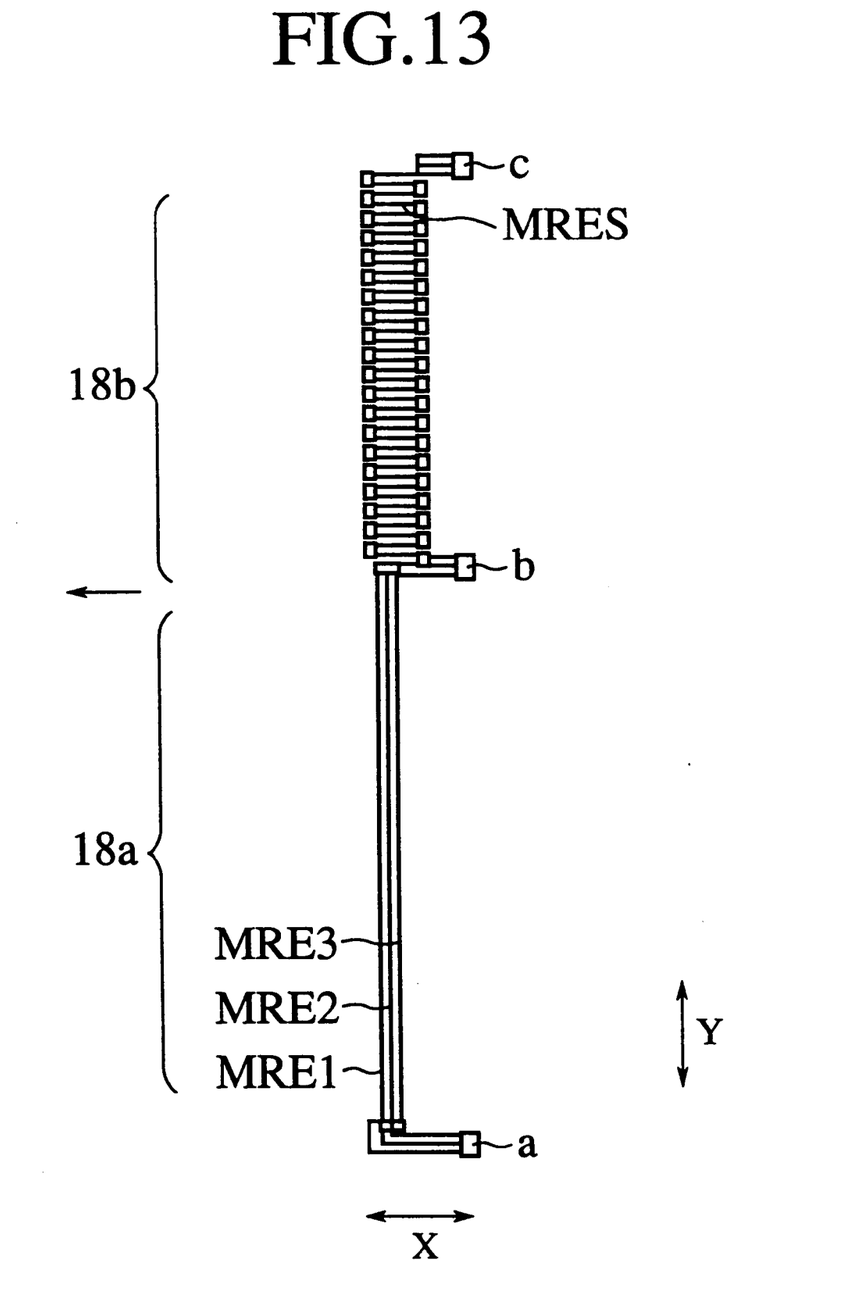
FIG. 13 is a diagram showing a constitution of the magnetoresistive effect element of the first embodiment.

FIG. 13 shows the structure of the magnetoresistive effect element 18. In the element 18, the magnetoresistive effect element 18b is connected to the magnetoresistive effect element 18a. The magnetororesistive effect element 18a includes a terminal (a) to which three patterns of elongated elements MRE1, MRE2, and MRE3 as micro magnetororesistive means are connected in series and to which power is supplied. In the figure, the elements MRE1, MRE2, and MRE3 are arranged so as to extend in a vertical direction Y, i.e. a direction perpendicular to a direction X facing the gear 11.

A distance from the element MRE1 up to the element MRE3 in the direction X is sufficiently small. The pattern size (i.e. a vertical length) of the magnetoresistive effect element 18a is e.g. several times to dozens times as long as the above distance from the element MRE1 up to the element MRE3 in the direction X.

On the other hand, the magnetororesistive effect element 18b includes about ten to twenty elements MRES which form a plurality of short patterns in the horizontal direction X and which are connected with each other in series, and a ground terminal (c). In the element 18, sensor outputs are generated through a center terminal (b). The size (i.e. a length in the direction X) of the short patterns is somewhat larger than the size of the direction X extending from the element MRE1 to the element MRE3 (i.e. a length in the direction X).

The magnetoresistive effect element 18a is arranged in the direction perpendicular to the direction X facing the gear 11, while the magnetoresistive effect element 18b is arranged in the direction X. In each magnetoresistive effect element 18a, 18b, the resistance varies dependent on an angle, which is made by a direction of an electrical current passing the element itself and another direction of the magnetic field, and a magnetic field intensity.

In case of the angle of 90 degrees made by the current direction and the magnetic field direction, then the magnetoresistive effect element 18a has the resistance changed by the magnitude of magnetic field intensity in the direction X facing the gear 11.

In case of the angle of 0 degrees made by the current direction and the magnetic field direction, the resistance of the magnetoresistive effect element 18b does not change irrespective of the magnitude of magnetic field intensity. Since the resistance of the magnetoresistive effect element 18a solely changes in this case, the output of the element 18a is employed.

According to the magnetic detection device mentioned above, not only bias magnetic field directing the gear 11 but bias magnetic field in the moving direction of the gear 11 are generated from the bias magnet 25a.

Additionally, since the magnetoresistive effect element 18 is arranged so as to oppose the bias magnet 25a and adjoin the pole face of the magnet 25a on the gear's side and also arranged in the plane substantially perpendicular to the moving direction of the gear 11, the bias magnetic field in the moving direction of the gear 11 is modulated into the direction X by the movement of the gear 11 (occurrence of deflection), penetrating the magnetoresistive effect element 18. That is, with the movement of the gear 11, the bias magnetic field component directing the gear 11 does change.

Then, the elements MRE1 and MRE3 constituting the magnetoresistive effect element 18a are arranged in a plane substantially perpendicular to the moving direction of the gear 11 (i.e. in a plane in parallel with opposing magnet faces of the magnet 25a) and arranged in a direction Y perpendicular to the direction X. Consequently, corresponding to the movement of the gear 11, the resistance of the magnetoresistive effect element 18a changes owing to the varying magnetic field intensity in the direction X since the angle made by the current direction and the magnetic field direction is about 90 degrees.

Furthermore, since the magnitude of modulation for the bias magnetic field (a change of magnetic field by the movement of the gear 11) has a maximum value in the vicinity of the pole face of the bias magnet 25a on the gear's side, the above-mentioned positioning of the magnetoresistive effect element 18 allows a large change of the resistance to be obtained, whereby it is possible to provide the magnetic detection device with high sensitivity.

Figure 14:
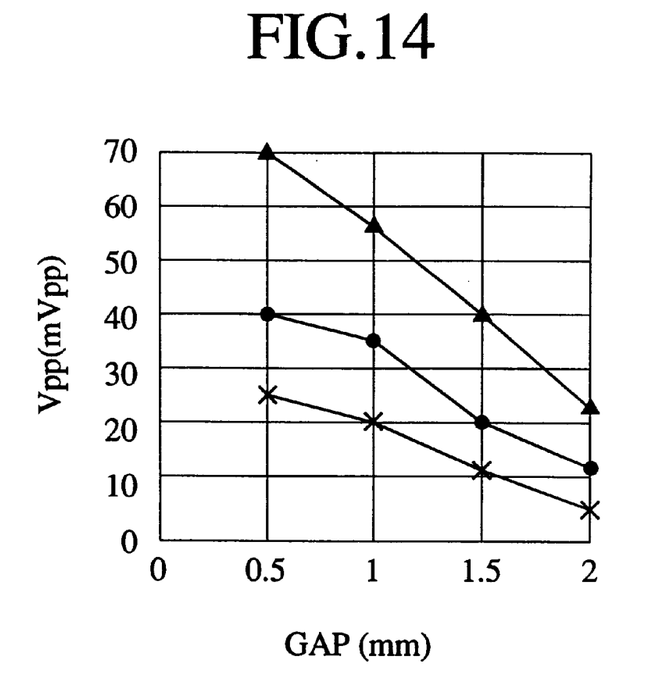
FIG. 14 is a diagram showing a relationship between sensitivity and detected gap of the magnetic detection device of the first embodiment.

FIG. 14 shows a relationship between the detected gap and the sensitivity of the magnetoresistive effect element. In FIG. 14, a line connecting marks ▲ designates the relationship of the magnetoresistive effect element 18 of 30 $\mu$m dimension in the direction X. From the figure, it will be understood that the sensitivity exhibits about 23 mV in case of the detected gas of 2 mm, while the sensitivity exhibits about 70 mV in case of the detected gap of 0.5 mm.

On the contrary, in the conventional magnetic detection device represented by FIG. 6, the sensitivity exhibits about 5 mV in case of the detected gap of 2 mm, while the sensitivity exhibits about 42 mV in case of the detected gap of 0.5 mm, as shown with marks X. Consequently, it will be understood that the sensitivity of the device in accordance with the first embodiment is considerably higher than that of the conventional device.

In FIG. 14, a line connecting marks ● designates the relationship of the magnetororesistive effect element 18 of 90 $\mu$m dimension in the direction X, also showing the sensitivity of about 12 mV in case of the detected gap of 2 mm. While, in the conventional magnetic detection device represented by FIG. 6, the sensitivity exhibits about 5 mV in case of the detected gap of 2 mm, as shown with marks X. A line connecting marks X of FIG. 14 designates the relationship of the magnetororesistive effect element 18 of 300 $\mu$m dimension in the direction X, also showing the sensitivity of about 6 mV in case of the detected gap of 2 mm.

From the above-mentioned results, it will be understood that the smaller the dimension of the direction X becomes, the higher sensitivity the magnetoresistive effect element 18 has. In this way, it is possible to improve the sensitivity of the element with respect to the detected gap and abolish the dependency of sensitivity on the gap of the bias magnet 25a.

Further, owing to the use of the only bias magnet 25a, it is possible to miniaturize the magnetic detection device. For example, in case of the magnetic sensor of FIG. 12, even if the bias magnet 25a, the insulating substrate 20, the magnetoresistive effect element 18 and the plural electronic parts 21 having signal processing circuits are installed in the outer casing 12, the outside horizontal dimension of the outer casing 12 is only 5 mm, thereby providing such a compact sensor that it has never been provided hitherto. Moreover, by using the single bias magnet 25a, it is possible to increase a thickness of the magnet in view of the magnetic field intensity.

As shown in FIG. 11, the magnetoresistive effect element 18 is disposed in the diverging bias magnetic field. Thus, there is a difference in magnetic field that the magnetoresistive effect element 18 detects, depending on a position thereof in the plane. Since the reduction of sensitivity and waveform distortion originate in the positioning of the element 18, it is desirable to dispose the magnetoresistive effect element 18 in the uniform magnetic field.

In the normal bias magnet 25a, the divergence of the bias magnetic field in the direction Y perpendicular to the direction X is so small as to be neglectable in comparison with that of the bias magnetic field in the direction X. Further, due to the detection of the bias magnetic field in the direction X, it is necessary to reduce variance of the bias magnetic field applied on the magnetoresistive effect element 18a in the direction X.

Figure 15:
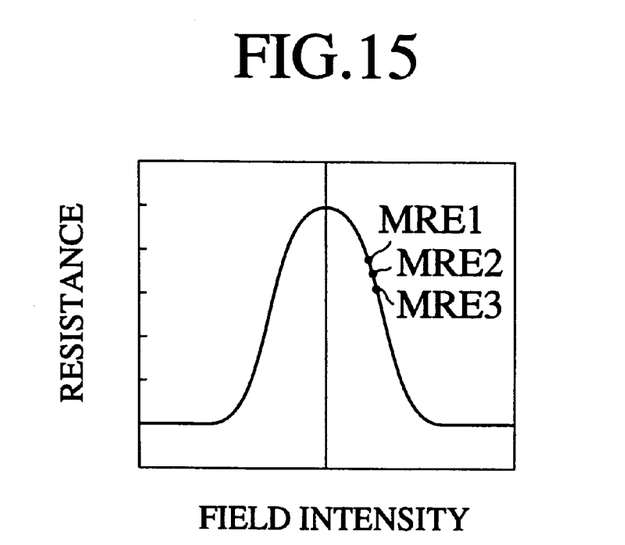
FIG. 15 is a diagram showing respective magnetic working points of elements MRE1 to MRE3 of the magnetoresistive effect element of FIG. 13.

Under such a situation, by forming such elongated patterns consisting of the elements MRE1 and MRE3 of the magnetororesistive effect element 18a and reducing a distance in the direction X from the elements MRE1 to MRE3 in comparison with the same distance in the direction Y, it is possible to miniaturize the magnetic field distribution in the direction X. Consequently, as shown in FIG. 15, the respective resistances of the elements MRE1, MRE2, MRE3 with respect to the magnetic field intensity are close to each other.

In other words, it is possible to decrease the differences among the working points in the magnetoresistive effect element 18a. Accordingly, in case of varying the magnetic field in a predetermined range as the centers of the respective working points for the elements MRE1, MRE2 and MRE3, the resultant resistance changes with respect to time respectively represent the identical sine waveforms with no distortion and little difference among the elements MRE1, MRE2 and MRE3 (see FIG. 16).

Figure 16:
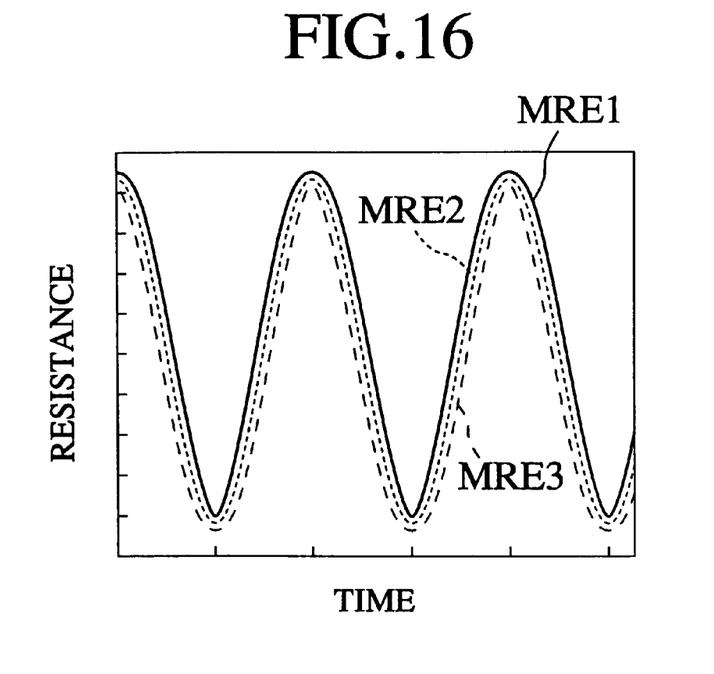
FIG. 16 is a diagram showing respective changes of resistances of the respective elements MRE1 to MRE3.
Figure 17:
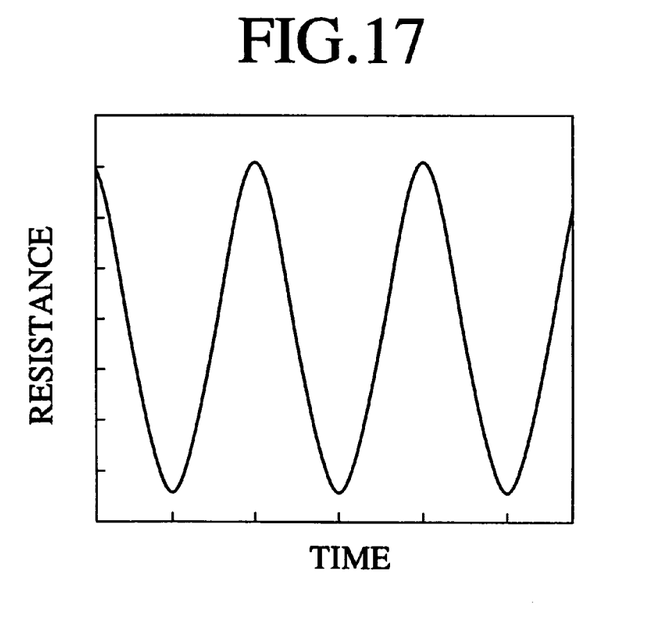
FIG. 17 is a diagram showing a change of composite resistance value of the respective elements MRE1 to MRE3.

FIG. 17 shows a sine waveform with no distortion of the composite magnetoresistive (combined resistance) composed of the respective waveforms of the elements MRE1, MRE2 and MRE3 shown in FIG. 16. Thus, in this embodiment, the shown composite resistance stands for the resistance of the magnetoresistive effect element 18a. As mentioned before, since the sensor output is obtained by the change of the resistance, it is possible to realize the stable sensor output having no distortion. Further, as the fluctuation of the bias magnetic field in the direction perpendicular to the direction X is small, there is little influence caused by elongating the patterns in the former direction.

Although the magnetoresistive effect element 18 is constituted by the magnetoresistive effect element 18a and the magnetororesistive effect element 18b in the first embodiment, the only magnetoresistive effect element 18a may be used in the modification, for example. Because the resistance change with respect to the change of magnetic field caused corresponding to the movement of the gear 11 is determined by the magnetoresistive effect element 18a only.

In addition, although the angle by the patterns of the magnetoresistive effect element 18a and the direction X facing the gear 11 is set to 90 degrees in the above-mentioned embodiment, the angle may be modulated to another angle in the vicinity of 90 degrees, e.g. 80 degrees.

2nd Embodiment

We now describe the magnetic detection device in accordance with the second embodiment of the present invention.

Note, in the first embodiment, the device employs a so-called "half-bridge" type of magnetoresistive effect element 18 consisting of the magnetoresistive effect element 18a and the magnetoresistive effect element 18b.

Figure 18:
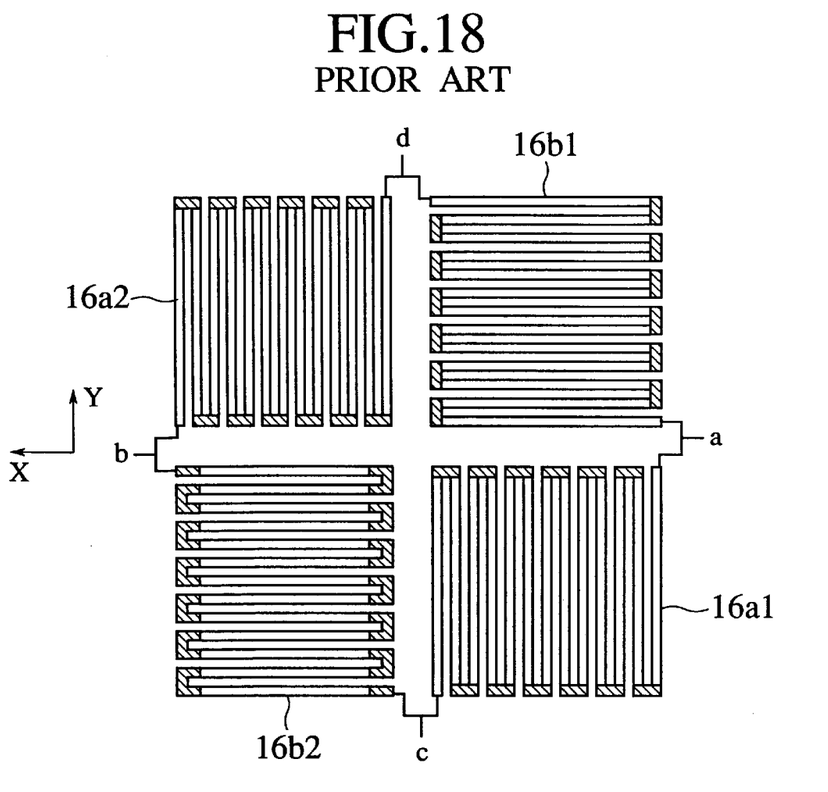
FIG. 18 is a structural diagram showing a prior art "full-bridge" type of magnetoresistive effect element.

On the other hand, the device in accordance with the second embodiment employs a "full-bridge" type of magnetoresistive effect element consisting of two magnetoresistive effect elements 18 of the half-bridge type. At first, the prior art "half-bridge" type of magnetoresistive effect element is shown in FIG. 18.

In the shown magnetoresistive effect element, one end of a magnetoresistive effect element 16a1 with vertical patterns and one end of a magnetoresistive effect element 16b1 with horizontal patterns are commonly connected with the intermediate terminal (a). The other end of the magnetoresistive effect element 16b1 and one end of a magnetoresistive effect element 16a2 with vertical patterns are commonly connected with an intermediate terminal (d).

The other end of the magnetoresistive effect element 16a2 and one end of a magnetoresistive effect element 16b2 with horizontal patterns are commonly connected with the intermediate terminal (b). The other end of the effect element 16b2 and the other end of the magnetoresistive effect element 16a1 are commonly connected with the intermediate terminal (c).

Figure 19:
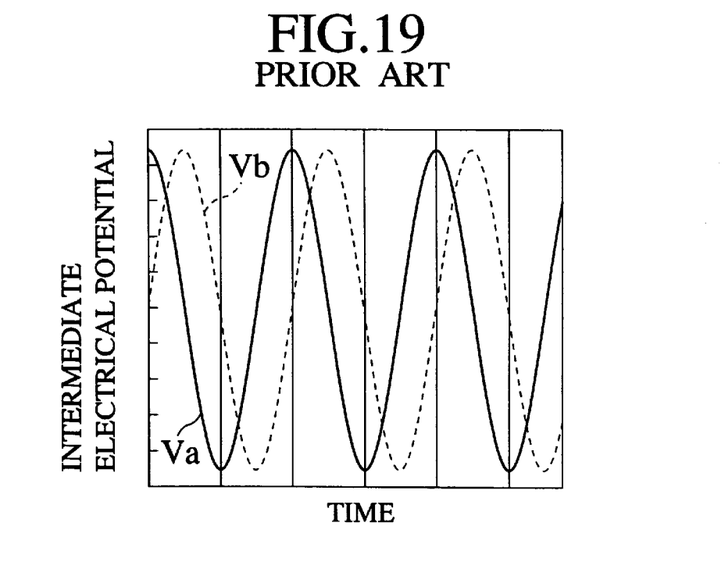
FIG. 19 is a diagram showing waveforms of intermediate voltages at intermediate terminals of the prior art "full-bridge" type of magnetoresistive effect element.

FIG. 19 shows a change of the intermediate electrical potential Va picked up from the terminal (a) of the above-mentioned magnetoresistive effect element of full-bridge type and another change of the intermediate electrical potential Vb picked up from the terminal (b) of the same element.

In the "full-bridge" type of magnetoresistive effect element as above, since four magnetoresistive effect elements 16a1–16b2 are arranged with considerably long sizes in the direction X, a phase different of the intermediate electrical potential of the respective intermediate terminals is disadvantageously deviated from 180 degrees, in addition to the above-mentioned problem of waveform distortion of the sensor output.

Figure 20:
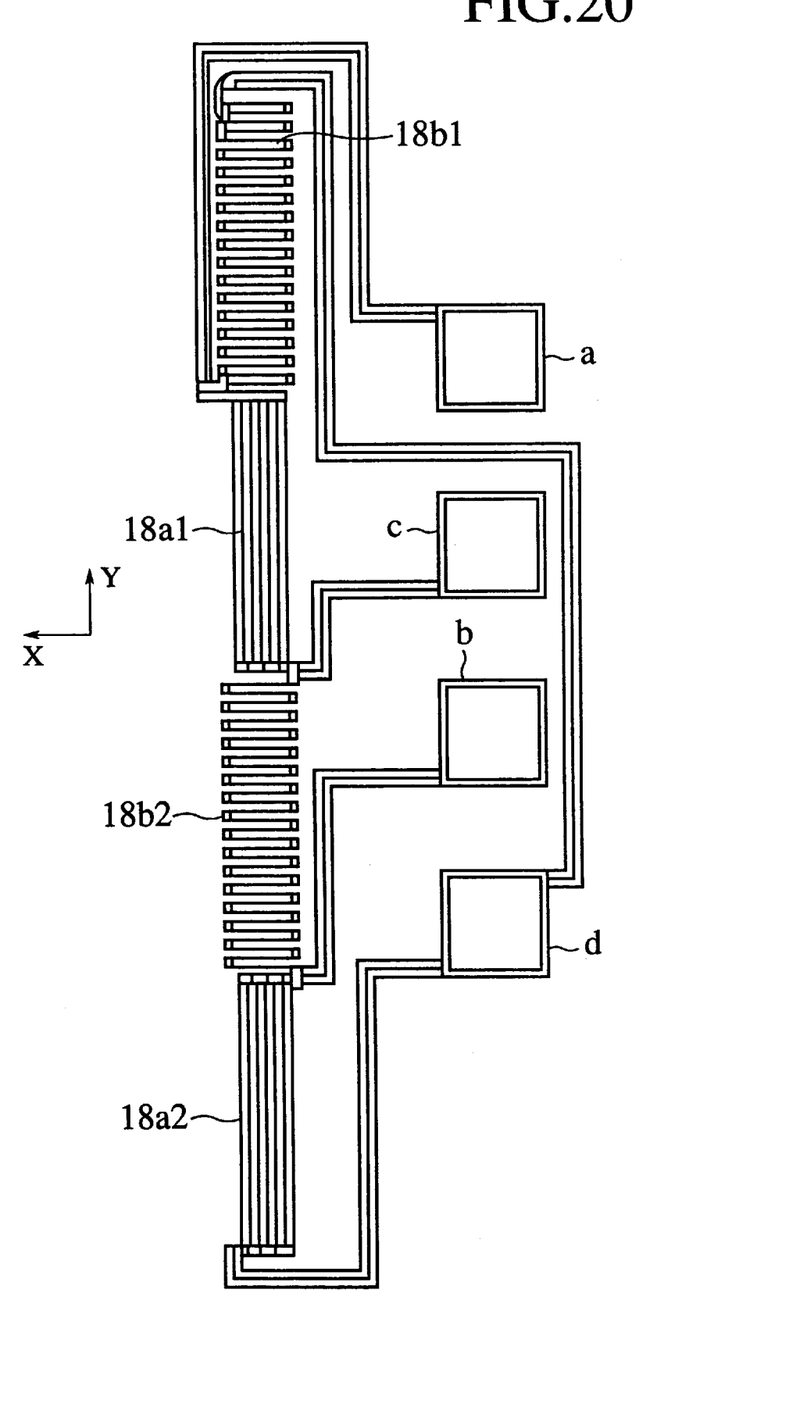
FIG. 20 is a diagram showing a constitution of the magnetoresistive effect element in accordance with a second embodiment of the present invention.

Under such a situation, in order to realize the phase difference of 180 degrees, the second embodiment employs the "full-bridge" type of magnetoresistive effect element shown in FIG. 20. In the shown element, one end of a magnetoresistive effect element 18a1 with vertical patterns and one end of a magnetoresistive effect element 18b1 with horizontal patterns arranged in the direction Y are connected with the intermediate terminal (a).

The other end of the effect element 18b1 and one end of a effect element 18a2 with vertical patterns arranged in the direction Y are connected with the intermediate terminal (d). The other end of the effect element 18a2 and one end of a effect element 18b2 with horizontal patterns arranged in the direction Y are connected with the intermediate terminal (c).

The effect elements 18a1, 18a2 are identical to the effect element 18a of FIG. 13 in term of constitution, while the effect elements 18b1, 18b2 are identical to the effect element 18b in constitution. Again, four effect elements 18a1, 182a, 18b1, 18b2 are arranged in the vicinity of the pole face of the bias magnet 25a on the side of the gear 11.

Figure 21:
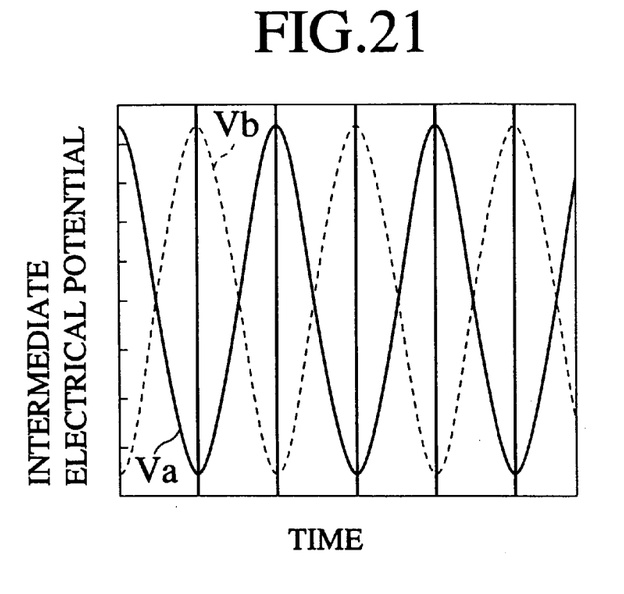
FIG. 21 is a diagram showing waveforms of intermediate voltages at intermediate terminals of the "full-bridge" type of magnetoresistive effect element of the second embodiment.

FIG. 21 shows a change of the intermediate electrical potential Va picked up from the terminal (a) of the present effect element of full-bridge type and another change of the intermediate electrical potential Vb picked up from the terminal (b).

In the "full-bridge" type of effect element as above, since four effect elements 18a1–18b2 are arranged with short sizes in the direction X, it is possible to remove the waveform distortion of the sensor output and accomplish a phase difference of the intermediate electrical potential of the respective intermediate terminals of 180 degrees.

Figure 22:
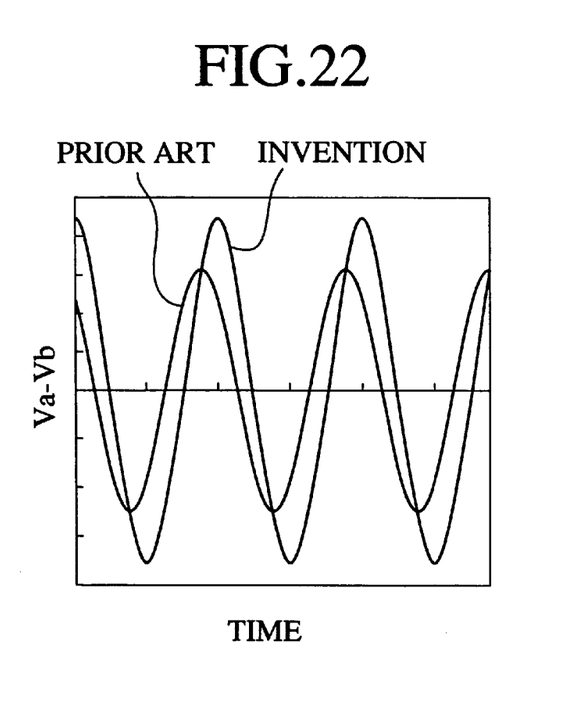
FIG. 22 is a diagram showing a comparison of the intermediate voltage difference of the conventional "full-bridge" type of magnetoresistive effect element with that of the "full-bridge" type of magnetoresistive effect element of the second embodiment.

Hereat, the change of voltage difference, which is obtained by subtracting the intermediate electrical potential Vb at the terminal (b) from the intermediate electrical potential Va at the terminal (a), with respect to time is shown in FIG. 22. From this figure, it will be noted that, in the conventional element, the intermediate voltage difference is relatively small since the phase difference between the intermediate electrical potential Va and Vb is deviated from 180 degrees (see FIG. 19). For this reason, the conventional element has small sensor outputs.

On the contrary, in the magnetoresistive effect element of the present invention, the intermediate voltage difference is relatively large since the phase difference between the intermediate electrical potential Va and Vb is 180 degrees, as shown in FIG. 22. Thus, providing that the magnetoresistive effect element of FIG. 20 is employed, it is possible to obtain high sensor outputs with no waveform distortion.

Note, in the modification, the above-mentioned "full-bridge" type of magnetoresistive effect element may be attached on the insulating substrate 20 on which the electronic parts 21 or the like in the first embodiment are assembled.

What is claimed is:

1. A magnetic detection device, comprising:
    a bias magnet producing a magnetic field to an object having a magnetic substance; and
    magnetoresistive means, arranged so as to oppose said bias magnet and adjoin a pole face thereof on a side of said object and arranged in a plane substantially perpendicular to a moving direction of said object, for producing a change of resistance by a change of the magnetic field in response to a movement of said object,
    wherein said magnetoresistive means comprises a first magnetoresistive means including a plurality of first micro-magnetoresistive elements juxtaposed along a first direction facing said object and connected with each other in series, said plurality of first micro-magnetoresistive elements respectively forming elongated patterns extending in a second direction generally perpendicular to the first direction,
    wherein a width of said plurality of first micro-magnetoresistive elements in the first direction is smaller than a dimension of said elongated patterns in the second direction by a predetermined length, and
    wherein said magnetoresistive means further comprises a second magnetoresistive means connected to said first magnetoresistive means in series and arranged adjacently to a pole face of said bias magnet on the side of the object, said second magnetoresistive means including a plurality of second micro-magnetoresistive elements juxtaposed along the second direction and which respectively form patterns extending in the second direction with a dimension substantially equal to the width of said plurality of first micro-magnetoresistive elements.

2. A magnetic detection device as claimed in claim 1, wherein said plurality of first micro-magnetoresistive elements include a terminal to which an electrical power is supplied.

3. A magnetic detection device as claimed in claim 1, wherein said second micro-magnetoresistive elements include a ground terminal.

4. A magnetic detection device as claimed in claim 3, wherein said magnetoresistive means is provided, between said plurality of first micro-magnetoresistive elements and said plurality of second micro-magnetoresistive elements, with an output terminal of the magnetic detection device.

5. A magnetic detection device as claimed in claim 1, wherein said magnetoresistive means further comprises:
    a third magnetoresistive means connected to said second magnetoresistive means and arranged so as to extend along the second direction and adjoin the pole face of said bias magnet on the side of the object, said third magnetoresistive means having a form identical to that of said first magnetoresistive means; and
    a fourth magnetoresistive means connected to said third magnetoresistive means and said first magnetoresistive means and arranged so as to extend along the second direction and adjoin the pole face of said bias magnet on the side of the object, said fourth magnetoresistive means having a form identical to that of said second magnetoresistive means.

6. A magnetic detection device, comprising:
    a bias magnet configured to produce a magnetic field toward an object having a magnetic substance; and
    a magnetoresistive mechanism configured to produce a change of resistance corresponding to a change of the magnetic field caused by a movement of the object, and being arranged so as to oppose the bias magnet and adjoin a pole face of the magnet facing a side of the object and being arranged in a plane substantially perpendicular to a moving direction of the object, said magnetoresistive mechanism including:
    a plurality of first micro-magnetoresistive elements juxtaposed along a first direction facing the object and connected with each other in series, said first magnetoresistive elements respectively forming elongated patterns extending in a second direction generally perpendicular to the first direction; and
    a plurality of second micro-magnetoresistive elements connected to the plurality of first micro-magnetoresistive elements and being juxtaposed along the second direction and which respectively form patterns extending in the second direction with a dimension substantially equal to the width of the plurality of first micro-magnetoresistive elements,
    wherein a width of the plurality of first micro-magnetoresistive elements in the first direction is smaller than a dimension of said elongated patterns in the second direction by a predetermined length.

7. A magnetic detection device as claimed in claim 6, wherein the plurality of first micro-magnetoresistive elements include a terminal to which an electrical power is supplied.

8. A magnetic detection device as claimed in claim 6, wherein the plurality of second micro-magnetoresistive elements include a ground terminal.

9. A magnetic detection device as claimed in claim 6, further comprising:
    an output terminal disposed between the plurality of first micro-magnetoresistive elements and the plurality of second micro-magnetoresistive elements.

10. A magnetic detection device as claimed in claim 6, wherein said magnetoresistive mechanism further comprises:
    a plurality of third micro-magnetoresistive elements connected to the plurality of second micro-magnetoresistive elements and arranged so as to extend along the second direction and adjoin the pole face of the bias magnet on the side of the object, the plurality of third micro-magnetoresistive elements having a form identical to that of the plurality of first micro-magnetoresistive elements, and a plurality of fourth micro-magnetoresistive elements connected to the plurality of third micro-magnetoresistive elements and the plurality of first micro-magnetoresistive elements, and arranged so as to extend along the second direction and adjoin the pole face of the bias magnet on the side of the object, the plurality of fourth micro-magnetoresistive elements having a form identical to that of the plurality of second micro-magnetoresistive elements.

* * * * *